(12) United States Patent
Yen

(10) Patent No.: US 8,704,251 B1
(45) Date of Patent: Apr. 22, 2014

(54) LIGHT-EMITTING DEVICE

(71) Applicant: Epistar Corporation, Hsinchu (TW)

(72) Inventor: Sheng-Horng Yen, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

(21) Appl. No.: 13/782,741

(22) Filed: Mar. 1, 2013

(51) Int. Cl.
*H01L 33/00* (2010.01)

(52) U.S. Cl.
USPC .......................................................... 257/96

(58) Field of Classification Search
USPC ............................................... 257/13, 79, 96
See application file for complete search history.

(56) References Cited

U.S. PATENT DOCUMENTS

| | | | |
|---|---|---|---|
| 4,984,242 A * | 1/1991 | Scifres et al. | 372/45.011 |
| 6,504,171 B1 * | 1/2003 | Grillot et al. | 257/14 |
| 6,955,933 B2 | 10/2005 | Bour et al. | |
| 7,122,839 B2 | 10/2006 | Shen et al. | |
| 7,626,209 B2 | 12/2009 | Lee et al. | |
| 2006/0169990 A1 * | 8/2006 | Taki et al. | 257/79 |
| 2006/0192218 A1 * | 8/2006 | Kyono et al. | 257/96 |

* cited by examiner

*Primary Examiner* — Marcos D. Pizarro
*Assistant Examiner* — Sue Tang
(74) *Attorney, Agent, or Firm* — Muncy, Geissler, Olds & Lowe, P.C.

(57) ABSTRACT

Disclosed is a light-emitting device. The light-emitting device comprises: a first conductivity type semiconductor layer; a second conductivity type semiconductor layer; and an active region comprising a material having a composition of $Al_xIn_yGa_{(1-x-y)}N$ ($0 \leq x \leq 1$, $0 \leq y \leq 1$, $0 \leq x+y \leq 1$) between the first conductivity type semiconductor layer and the second conductivity type semiconductor layer, wherein the active region comprising: a plurality of barriers and one well disposed between any two of adjacent barriers, wherein the barriers comprises a composite barrier and a single barrier while the composite barrier is composed of a gradient layer having an element with a gradient concentration therein and a first non-gradient layer having a non-gradient composition, and the single barrier is composed of a second non-gradient layer adjacent to the first conductivity type semiconductor layer or the second conductivity type semiconductor layer.

20 Claims, 5 Drawing Sheets

E=-1.330x10⁶(V/cm)

E=-1.128x10⁶(V/cm)

LIGHT-EMITTING DEVICE

TECHNICAL FIELD

The application relates to a light-emitting device, in particular to a light-emitting device with a reduced built-in electric field.

DESCRIPTION OF BACKGROUND ART

The theory for a light-emitting diode (LED) to emit light is that when a forward voltage is applied to a p-n junction, the electrons are driven from the n-type semiconductor and the holes are driven from the p-type semiconductor, and these carriers are combined in an active region to emit light. The efficiency of an LED depends on the Internal Quantum Efficiency (IQE). The IQE depends on the combining rate of the electrons from the n-type semiconductor and the holes from the p-type semiconductor, and is reduced by the built-in electric field.

The built-in electric field is an effect due to the existence of polarized electric charges which arise from a piezoelectric characteristic and a spontaneous polarization as a result of the characteristics of the LED's materials. The built-in electric field is particularly significant for materials comprising a composition of $Al_xIn_yGa_{(1-x-y)}N$ because of the wurtzite or zinc blende structure of the material. For example, an LED which adopts $Al_xIn_yGa_{(1-x-y)}N$ films grown along the polar c-direction of a sapphire substrate suffers from the undesired built-in electric field.

FIG. 1 shows the schematic diagram of the energy band of an active region of an unbiased conventional $Al_xIn_yGa_{(1-x-y)}N$ light-emitting diode. The active region comprises two GaN barrier layers 103b with an InGaN well layer 103w therebetween. All layers are of wurtzite crystal structure. The horizontal axis represents position in the active region along a line substantially in parallel to a direction which the layers are stacked. The interfaces between the layers are indicated by dashed lines. The vertical axis represents the energy of the conduction band (marked by Ec) and the energy of the valence band (marked by Ev) for the layers. The difference between energy of the conduction band and energy of the valence band is called the energy band gap.

In the absence of a spontaneous polarization, piezoelectric fields, and an externally applied bias, the conduction band Ec and valence band Ev are substantially flat within each layer. However, as shown in the figure, the built-in electric field due to the existence of polarized electric charges tilts the bands. The tilt adversely affects the IQE, and as a result, the electron wave function 103we and the hole wave function 103wh are concentrated on opposite sides of InGaN well 103w. The spatial overlap of these wave functions is therefore reduced and leads to a decrease of the probabilities of combination of electrons and holes. Hence, the IQE or the efficiency of an LED is reduced.

SUMMARY OF THE DISCLOSURE

A light-emitting device comprises: a first conductivity type semiconductor layer; a second conductivity type semiconductor layer; and an active region comprising a material having a composition of $Al_xIn_yGa_{(1-x-y)}N$ ($0 \le x \le 1$, $0 \le y \le 1$, $0 \le x+y \le 1$) between the first conductivity type semiconductor layer and the second conductivity type semiconductor layer, wherein the active region comprising: a plurality of barriers and one well disposed between any two of adjacent barriers, wherein the barriers comprises a composite barrier and a single barrier while the composite barrier is composed of a gradient layer having an element with a gradient concentration therein and a first non-gradient layer having a non-gradient composition, and the single barrier is composed of a second non-gradient layer adjacent to the first conductivity type semiconductor layer or the second conductivity type semiconductor layer.

A light-emitting device, comprising: a first conductivity type semiconductor layer; a second conductivity type semiconductor layer; and an active region between the first conductivity type semiconductor layer and the second conductivity type semiconductor layer, the active region comprising: a plurality of barriers and one well disposed between any two of adjacent barriers, wherein the barriers comprises a composite barrier and a single barrier while the composite barrier is composed of a gradient layer having a gradient energy band gap and a first non-gradient layer having a first constant energy band gap, and the single barrier is composed of a second non-gradient layer having a second constant energy band gap adjacent to the first conductivity type semiconductor layer or the second conductivity type semiconductor layer.

DETAILED DESCRIPTION OF PREFERRED EMBODIMENTS

Figure 2:
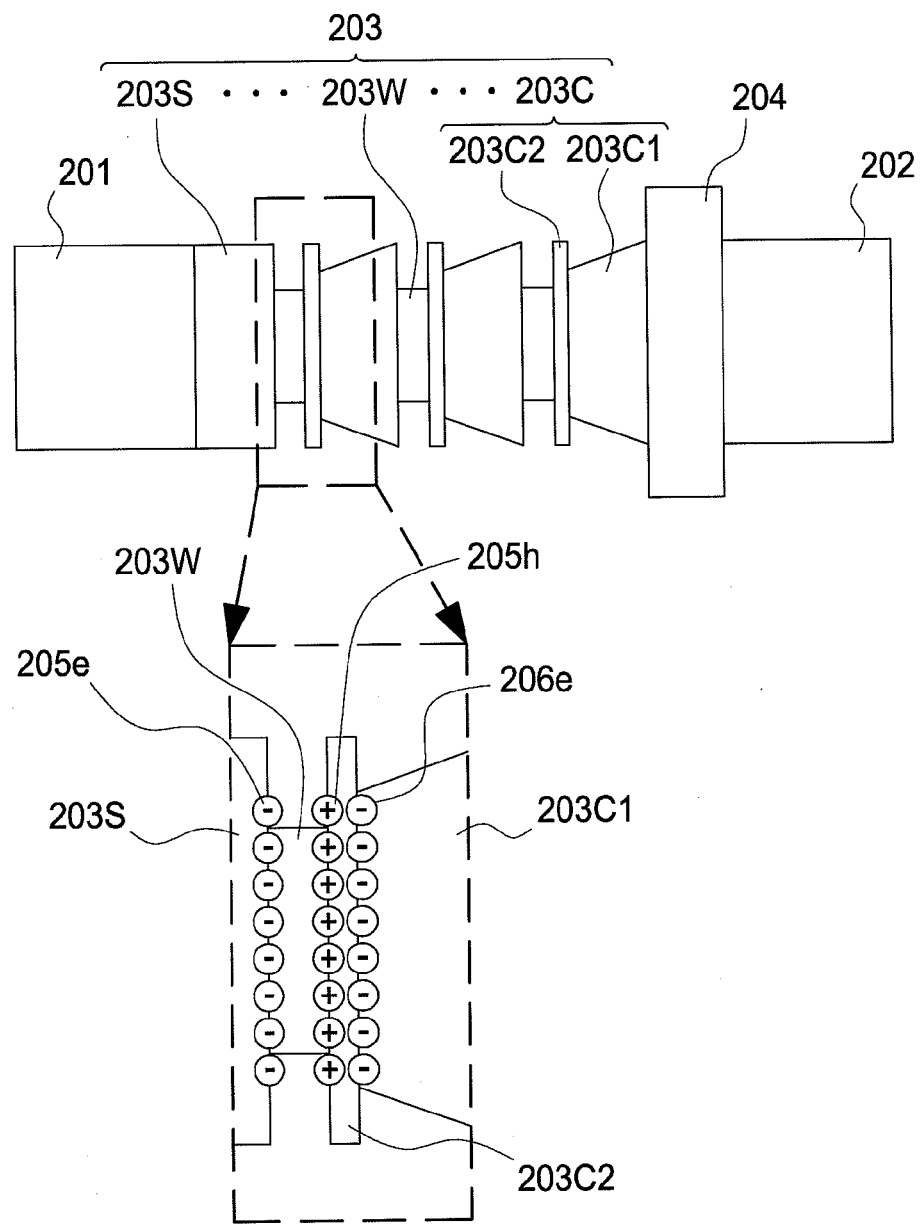
FIG. 2 shows the schematic diagram of the energy band of the light-emitting diode in accordance with the first embodiment of the present application.

FIG. 2 shows the schematic diagram of the energy band of the light-emitting diode in accordance with the first embodiment of the present application. The upper part of the schematic diagram shows that the light-emitting diode comprises a first conductivity type semiconductor layer 201, a second conductivity type semiconductor layer 202, and an active region 203. The light-emitting diode may further optionally comprise an electron-blocking layer (EBL) 204 disposed between the active region 203 and the second conductivity type semiconductor layer 202 to block and confine the electrons and alleviate overflow of electrons. The first conductivity type semiconductor layer 201 and the second conductivity type semiconductor layer 202 have different conductivity type. For example, the first conductivity type semiconductor layer 201 comprises an n-type semiconductor layer and the second conductivity type semiconductor layer 202 comprises a p-type semiconductor layer. When a forward voltage power is applied to the light-emitting diode, the electrons and the holes are driven from the first conductivity type semiconductor layer 201 and the second conductivity type semiconductor layer 202 respectively, and these carriers are combined in the active region 203 to emit light. The material for each layer comprises a composition of $Al_xIn_yGa_{(1-x-y)}N$ ($0 \le x \le 1$, $0 \le y \le 1$, $0 \le x+y \le 1$). For example, the first conductivity type semiconductor layer 201 is a GaN layer doped with Si and the second conductivity type semiconductor layer 202 is a GaN layer doped with Mg.

The active region 203 comprises one well and a plurality of barriers. Each well 203W is disposed between two adjacent barriers, and the thickness of the well 203W may be in a range of about 2 nm to 4 nm. In the present embodiment, each of the wells 203W comprises $In_yGa_{(1-y)}N$ with a thickness of about 2.5 nm, and the concentration of In (y) is 0.15. The concentration of In y is adjustable and depends on the light wavelength which the light-emitting diode is designed to emit, which is typically in a range from about 0.1 (for the light wavelength of 430 nm) to about 0.2 (for the light wavelength of 480 nm).

In this embodiment, the barrier adjacent to the first conductivity type semiconductor layer 201, i.e. the barrier 203S, is the single barrier. It is noted that all the barriers are composite barriers except that either one of the barriers adjacent to the first conductivity type semiconductor layer 201 and the second conductivity type semiconductor layer 202 is a single barrier. Each of the composite barriers 203C is composed of a gradient layer 203C1 and a non-gradient layer 203C2. The gradient layer 203C1 has an element with a gradient concentration therein. For example, for the $Al_xIn_yGa_{(1-x-y)}N$ material mentioned above, the element with a gradient concentration may be Al or In. That is, the concentration of Al (or In) in the gradient layer 203C1 grades with distance, for example, the distance from the first conductivity type semiconductor layer 201 (or from the second conductivity type semiconductor layer 202). In other words, the mole fraction of Al (or In) in the gradient layer 203C1 increases or decreases gradually toward the first conductivity type semiconductor layer 201 (or the second conductivity type semiconductor layer 202). As shown in the figure, the gradient layer 203C1 has a gradient energy band gap because of the gradual change of Al (or In) concentration.

In contrast, the non-gradient layer 203C2 has a non-gradient composition. That is, for the non-gradient layer 203C2, the concentration of each element in the non-gradient layer 203C2 is substantially constant with distance from the first conductivity type semiconductor layer 201 (or from the second conductivity type semiconductor layer 202). In other words, the mole fraction of the elements in the non-gradient layer 203C2 does not change toward the first conductivity type semiconductor layer 201 (or the second conductivity type semiconductor layer 202). Therefore the non-gradient layer 203C2 has a substantially constant energy band gap. In this embodiment, for each of the composite barriers 203C, the non-gradient layer 203C2 is disposed closer to the first conductivity type semiconductor 201 than the gradient layer 203C1. The thickness of the non-gradient layer 203C2 may be less than or equal to about 5 nm, and the thickness of the gradient layer 203C1 is in a range of about 3 nm to 15 nm. In the present embodiment, the non-gradient layer 203C2 comprises GaN with a thickness of about 5 nm, and the gradient layer 203C1 comprises $In_yGa_{(1-y)}N$ with a thickness of about 10 nm.

As mentioned above, the concentration of one of the elements in the gradient layer 203C1 grades with a distance from the first conductivity type semiconductor layer 201. In the present embodiment, the element with the gradient concentration is In and the concentration of In y in the gradient layer 203C1 closest to the non-gradient layer 203C2 is substantially the same as the concentration of In in the well 203W (It is noted that the diagram of the energy band in the figure is not specifically drawn to reflect this). That is, the concentration of In y is substantially equal to 0.15 when the gradient layer 203C1 adjoins the non-gradient layer 203C2, and the concentration of In y in the gradient layer 203C1 decreases gradually toward the second conductivity type semiconductor layer 202. The smallest concentration of In y is substantially the same as the concentration of In in the non-gradient layer. That is, the smallest concentration of In y is substantially equal to "0".

In contrast to the composite barrier 203C which is a combination of two layers (i.e., the gradient layer 203C1 and the non-gradient layer 203C2), the single barrier 203S is composed of only a non-gradient composition layer. The single barrier 203S has a substantially constant energy band gap. It is noted although both the non-gradient layer 203C2 of the composite barrier 203C and the single barrier 203S have substantially constant energy band gaps, their energy band gaps may be different, and they may also have different thicknesses. The thickness of the single barrier 203S may be in a range of about 5 nm to 15 nm. In the present embodiment, the single barrier 203S comprises a GaN layer having a non-gradient composition with a thickness of about 5 nm. As shown in FIG. 2, the active region 203 in this embodiment comprises three wells 203W and four barriers including three composite barriers 203C and one single barrier 203S.

The lower part of FIG. 2 illustrates how the light-emitting diode in accordance with this embodiment alleviates the built-in electric field caused by polarized electric charges. The enlarged lower part of the schematic diagram shows the distribution of charges of the part enclosed by the broken line marked in the upper part. As mentioned in the background, polarized electric charges arise from a piezoelectric characteristic and a spontaneous polarization as a result of the characteristics of the materials. The polarized electric charges are the electrons 205e and holes 205h which are spatially separated and located on opposite sides of the well 203W. Because of the introduction of the composite barrier 203C in the present application, electrons 206e are induced and distributed along the interface of the non-gradient layer 203C2 and the gradient layer 203C1 because of the lattice mismatch between the non-gradient layer 203C2 and the gradient layer 203C1. The electrons 206e induced in the composite barrier 203C counteract holes 205h. In other words, the electrons 206e provide an electrical shielding to reduce the built-in electric field, and the tilt of the energy band gap is reduced. Therefore, the IQE or the efficiency of the light-emitting diode is improved.

Figure 1:
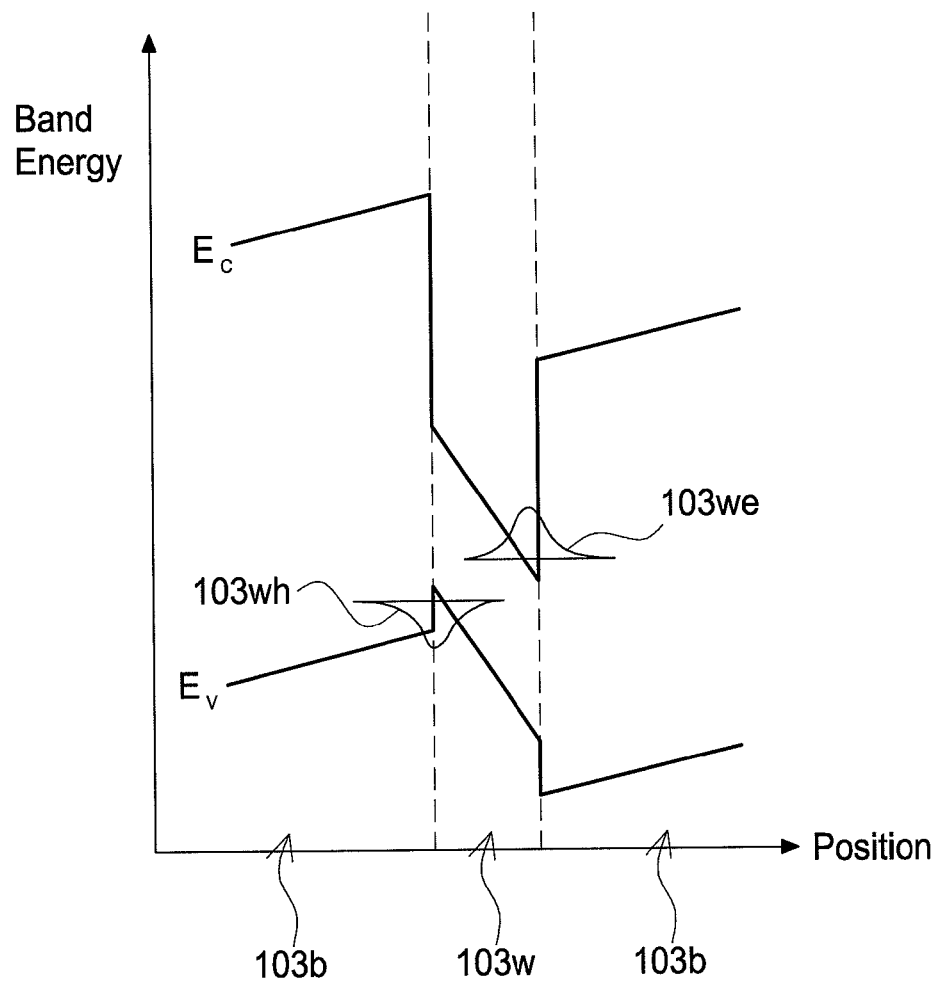
FIG. 1 shows the schematic diagram of the energy band of an active region of an unbiased conventional $Al_xIn_yGa_{(1-x-y)}N$ light-emitting diode.
Figure 4A:
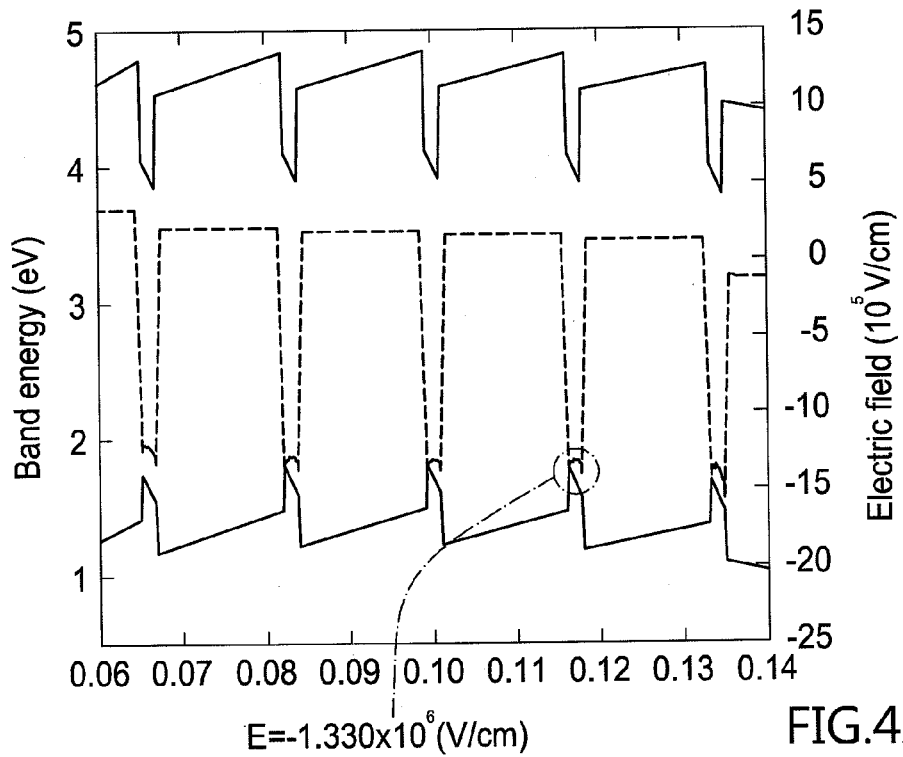
FIG. 4A shows the simulation result of the energy band and the electric field in the active region of a conventional light-emitting diode biased by a forward voltage.
Figure 4B:
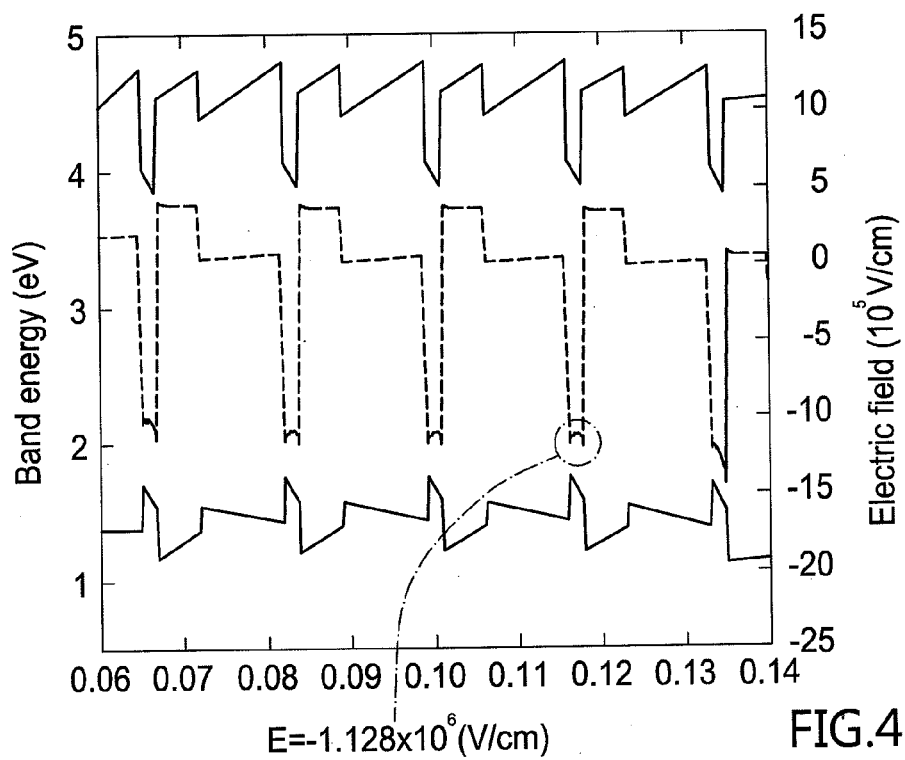
FIG. 4B shows simulation result of the energy band and the electric field in the active region of the light-emitting diode illustrated in FIG. 2 biased by a forward voltage.

FIG. 4A and FIG. 4B illustrate the simulation results of the band energy (left vertical axis) and the electric field (right vertical axis) in the active region of a conventional light-emitting diode biased by a forward voltage (FIG. 4A) and the light-emitting diode illustrated in FIG. 2 biased by the same forward voltage (FIG. 4B). It is noted that both the light-emitting diodes in FIG. 4A and FIG. 4B comprise six barriers and four wells, and each well is disposed between two adjacent barriers. Each of the FIG. 4A and FIG. 4B shows only part of the active region. The first conductivity type semiconductor layer, the second conductivity type semiconductor layer, and an electron-blocking layer (EBL) disposed between the active region and the second conductivity type semiconductor layer are not shown in each figure. The solid lines in FIG. 4A and FIG. 4B are the energy bands, and the band energy can be read on the left vertical axes. The broken lines in FIG. 4A and FIG. 4B show the electric field, and the strength of electric field can be read on the right vertical axes. The horizontal axes are position. In FIG. 4A, four barriers and five wells are shown while the leftest and the rightest in the figure are the barriers which are partly shown. The energy band of the partly-shown barrier in the rightest in the figure tilts differently from others because of the existence of the adjoining electron-blocking layer (EBL) which is disposed between the lightest barrier and the second conductivity type semiconductor layer. The EBL is AlGaN in this simulation. It can be seen that the profile and direction of tilt of energy bands are similar to those of energy bands shown in FIG. 1. The strength of the electric field in the well indicated by the circle is $1.33*10^6$ (V/cm). FIG. 4B illustrates the simulation results of the light-emitting diode having a structure similar to that illustrated in FIG. 2 but has different numbers of the barriers and wells. As mentioned above, it is noted that the light-emitting diode in the figure comprises six barriers and five wells, and four composite barriers and five wells are shown while the leftest and the rightest in the figure are the barriers which are partly shown. The leftest in the figure corresponds to the single barrier 203S in FIG. 2, and the lightest in the figure corresponds to a non-gradient layer 203C2 of a composite barrier 203C in FIG. 2. Similarly, the energy band of the non-gradient layer in the rightest in the figure tilts differently from other non-gradient layers because of the existence of the electron-blocking layer (EBL) which is AlGaN in this simulation. It can be seen that the profile of energy bands are similar to that of energy bands shown in FIG. 2. The strength of the electric field in the well indicated by the circle is $1.128*10^6$ (V/cm). Because FIG. 4A and FIG. 4B are given the same forward voltage, it can be seen that the strength of the electric field in the well in the light-emitting diode in accordance with each of the embodiments is relatively smaller than that of the conventional light-emitting diode because the built-in electric field is reduced by the aforementioned electrical shielding provided by electrons in the present application.

Figure 5:
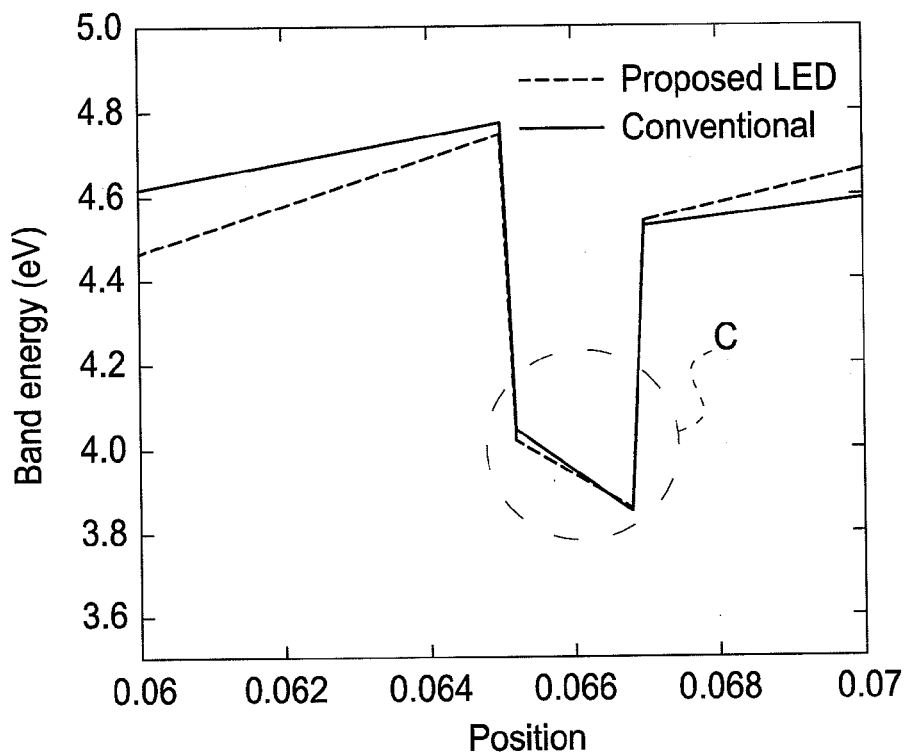
FIG. 5 shows magnified and superimposed conditions of energy bands of the wells in FIG. 4 A and FIG. 4B.

Referring to FIG. 5, the energy bands of the wells in FIG. 4A and FIG. 4B are magnified and superimposed (marked by the circle denoted as C). The solid line in FIG. 5 represents the energy band of the conventional light-emitting diode, and the broken line represents the energy band of the light-emitting diode in accordance with the LED disclosed in the embodiment of the present application. It can be seen that the tilt of the energy band of the well is alleviated in the light-emitting diode in accordance with the present embodiment. This result is consistent with the result of the reduced strength of the electric field mentioned above. The tilt of the energy band of the well is alleviated since the strength of the built-in electric field is reduced. Therefore the IQE or the efficiency of the light-emitting diode is increased.

Figure 6:
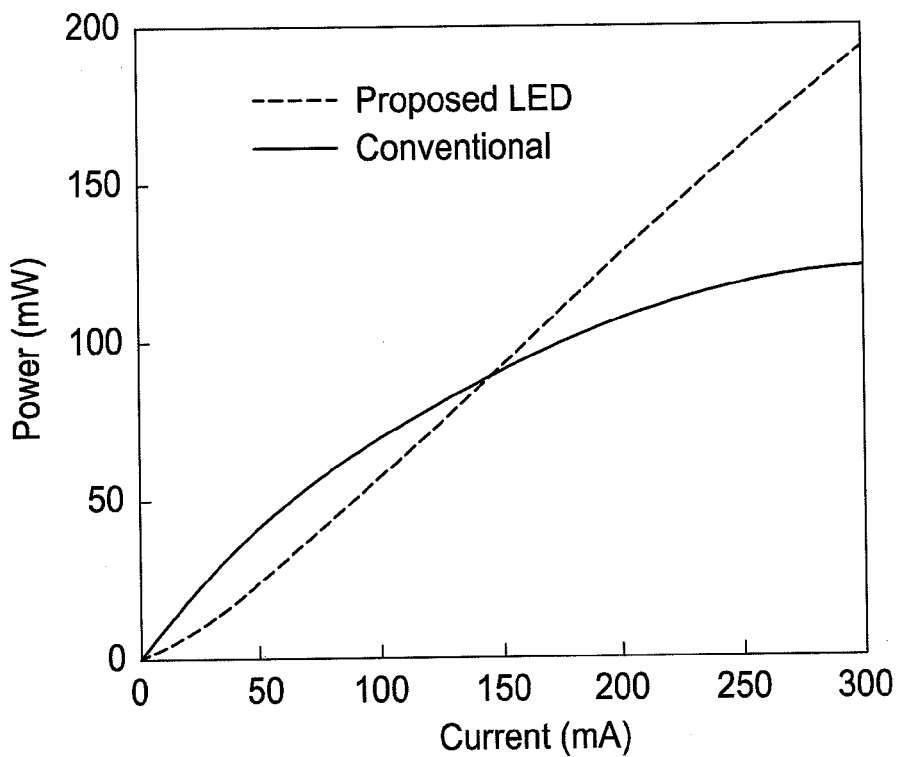
FIG. 6 shows a simulation result of the power versus current chart for the conventional light-emitting diode and the light-emitting diode in accordance with the embodiment in the present application as illustrated FIG. 4A and FIG. 4B.

FIG. 6 shows a simulation result of the power versus current chart for the conventional light-emitting diode and the light-emitting diode in accordance with the embodiment in the present application as respectively illustrated FIG. 4A and FIG. 4B. The solid line in FIG. 6 represents the curve of the conventional light-emitting diode, and the broken line represents the curve of the light-emitting diode in accordance with the embodiment in the present application. It can be seen that under a low current, for example, a current smaller than about 150 mA, the conventional light-emitting diode has a slightly better power performance than the light-emitting diode in accordance with the embodiment. However, under a high current, for example, above about 150 mA, the light-emitting diode in accordance with the embodiment has a better power performance than the conventional light-emitting diode. As the power increases, the difference in the power performance becomes larger because the conventional light-emitting diode suffers from a droop effect. In contrast, it can be seen that the light-emitting diode in accordance with the embodiment in the present application provides a good solution to the droop effect so that the power performance is good under a high current. It is because the built-in electric field also results in the droop effect, and since the strength of the built-in electric field is reduced, the power performance of the light-emitting diode in accordance with the embodiment in the present application is enhanced.

Figure 3:
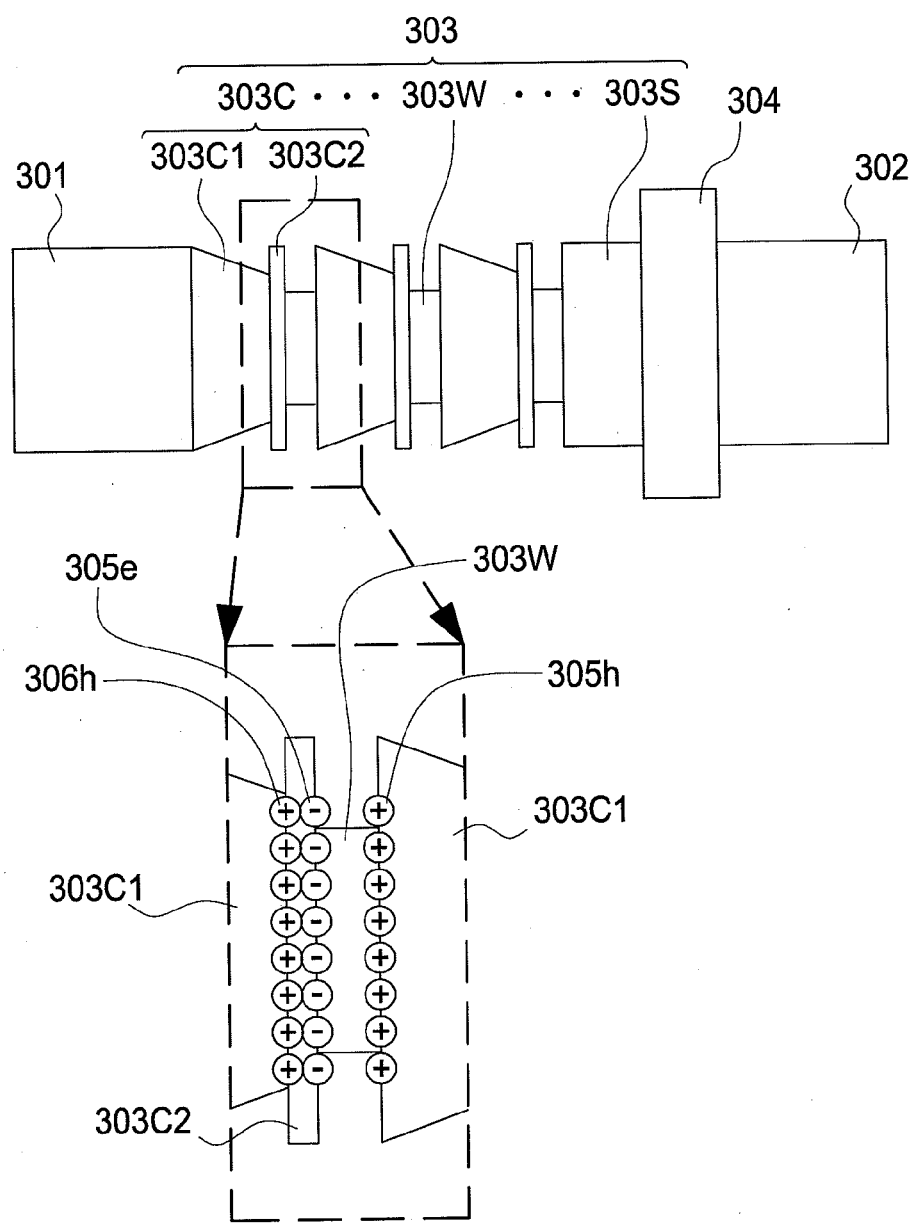
FIG. 3 shows the schematic diagram of the energy band of the light-emitting diode in accordance with the second embodiment of the present application.

FIG. 3 shows the schematic diagram of the energy band gap of the light-emitting diode in accordance with the second embodiment of the present application. It is noted that the elements in FIG. 3 are substantially the same as elements in FIG. 2. The element corresponding to the same element in FIG. 2 is labeled with the same label code except that the first digit is changed from "2" to "3". For example, element 301 in FIG. 3 is a first conductivity type semiconductor layer corresponding to the first conductivity type semiconductor layer 201 in FIG. 2. In FIG. 3, the embodiment illustrates the case which only the barrier adjacent to the second conductivity type semiconductor layer is the single barrier. That is, the barrier 303S which is adjacent to the second conductivity type semiconductor layer 302 in the present embodiment is the single barrier. And other barriers, as the composite barriers 303C shown in the figure, are composite barriers. Similar to the case illustrated in FIG. 2, each of the composite barriers 303C is composed of a gradient layer 303C1 and a non-gradient layer 303C2. However, compared with FIG. 2, it is noted that for each of the composite barriers 303C, it is the gradient layer 303C1 rather than the non-gradient layer 303C2 disposed closer to the first conductivity type semiconductor 301. This different arrangement of the relative positions between the gradient layer 303C1 and the non-gradient layer 303C2 is a change corresponding to the position where the composite barrier 303C is disposed. As illustrated below, such arrangement provides induced holes 306h to counteract the electrons 305e. Another corresponding change is the energy band gap in the gradient layer 303C1 decreases toward the second conductivity type semiconductor layer 302 in this embodiment while the energy band gap in the gradient layer 203C1 increases toward the second conductivity type semiconductor layer 202 in FIG. 2. For examples, when the element with the gradient concentration is Al, the concentration of Al in the gradient layer 303C1 decreases gradually toward the second conductivity type semiconductor layer 302.

As illustrated in FIG. 2, the lower part of the schematic diagram in FIG. 3 illustrates how the light-emitting diode in accordance with this embodiment alleviates the built-in electric field due to the existence of polarized electric charges. The enlarged view of the lower layer of the schematic diagram shows the distribution of charges of the part enclosed by the broken line marked in the upper part. In this embodiment, the polarized electric charges are the electrons 305e and holes 305h, which are spatially separated and located on opposite sides of the well 303W. As mentioned above, because of the introduction of the composite barrier 303C and the arrangement of the relative positions between the gradient layer 303C1 and the non-gradient layer 303C2, holes 306h are induced and distributed along the interface of the non-gradient layer 303C2 and the gradient layer 303C1 due to the lattice mismatch between the non-gradient layer 303C2 and the gradient layer 303C1. The holes 306h induced in the composite barrier 303C counteract the electrons 305e. In other words, the holes 306h provide an electrical shielding to reduce the built-in electric field. And therefore the tilt of the energy band gap is reduced. The IQE or the efficiency of the light-emitting diode is improved.

The foregoing description has been directed to the specific embodiments of this application. It will be apparent that other alternatives, modifications and materials may be made to the embodiments without escaping the spirit and scope of the application.

What is claimed is:

1. A light-emitting device, comprising:
   a first conductivity type semiconductor layer;
   a second conductivity type semiconductor layer; and
   an active region comprising a material having a composition of $Al_xIn_yGa_{(1-x-y)}N$ ($0 \leq x \leq 1$, $0 \leq y \leq 1$, $0 \leq x+y \leq 1$) between the first conductivity type semiconductor layer and the second conductivity type semiconductor layer, wherein the active region comprising:
   a plurality of barriers and one well disposed between any two of adjacent barriers, wherein the barriers comprises a composite barrier and a single barrier while the composite barrier is composed of a gradient layer having an element with a gradient concentration therein and a first non-gradient layer having a non-gradient composition, and the single barrier is composed of a second non-gradient layer adjacent to the first conductivity type semiconductor layer or the second conductivity type semiconductor layer,
   wherein the first non-gradient layer directly contacts with the well.

2. The light-emitting device as claimed in claim 1, wherein the single barrier is adjacent to the first conductivity type semiconductor layer.

3. The light-emitting device as claimed in claim 2, wherein the first non-gradient layer of each composite barrier is disposed closer to the first conductivity type semiconductor layer than the gradient layer is.

4. The light-emitting device as claimed in claim 3, wherein the element with the gradient concentration is In, and the concentration of In gradually decreases toward the second conductivity type semiconductor layer.

5. The light-emitting device as claimed in claim 3, wherein the element with the gradient concentration is Al, and the concentration of Al gradually increases toward the second conductivity type semiconductor layer.

6. The light-emitting device as claimed in claim 4, wherein the well comprises In element, and the In concentration in the gradient layer closest to the first non-gradient layer is substantially the same as the concentration of In element in the well.

7. The light-emitting device as claimed in claim 4, wherein the first non-gradient layer comprises In, and the smallest concentration of In in the gradient layer is substantially the same as the concentration of In element in the first non-gradient layer.

8. The light-emitting device as claimed in claim 1, wherein the single barrier is adjacent to the second conductivity type semiconductor layer.

9. The light-emitting device as claimed in claim 8, wherein the gradient layer of each composite barrier is disposed closer to the first conductivity type semiconductor layer than the first non-gradient layer is.

10. The light-emitting device as claimed in claim 9, wherein the element with the gradient concentration is In, and the concentration of In gradually increases toward the second conductivity type semiconductor layer.

11. The light-emitting device as claimed in claim 9, wherein the element with the gradient concentration is Al, and the concentration of Al gradually decreases toward the second conductivity type semiconductor layer.

12. The light-emitting device as claimed in claim 10, wherein the well comprises In element, and the In concentration in the gradient layer closest to the first non-gradient layer is substantially the same as the concentration of In element in the well.

13. The light-emitting device as claimed in claim 10, wherein the first non-gradient layer comprises In, and the smallest concentration of In in the gradient layer is substantially the same as the concentration of In element in the first non-gradient layer.

14. The light-emitting device as claimed in claim 1, wherein a thickness of the single barrier is in a range from about 5 nm to about 15 nm.

15. The light-emitting device as claimed in claim 1, wherein the single barrier comprises GaN.

16. The light-emitting device as claimed in claim 1, wherein a thickness of the first non-gradient layer is less than or equal to about 5 nm.

17. The light-emitting device as claimed in claim 1, wherein the first non-gradient layer comprises GaN.

18. The light-emitting device as claimed in claim 1, wherein a thickness of the gradient layer is in a range from about 3 nm to about 15 nm.

19. The light-emitting device as claimed in claim 1, wherein the gradient layer has a gradient concentration of In and has a thickness of about 10 nm.

20. A light-emitting device, comprising:
   a first conductivity type semiconductor layer;
   a second conductivity type semiconductor layer; and
   an active region between the first conductivity type semiconductor layer and the second conductivity type semiconductor layer, the active region comprising:
   a plurality of barriers and one well disposed between any two of adjacent barriers, wherein the barriers comprises a composite barrier and a single barrier while the composite barrier is composed of a gradient layer having a gradient energy band gap and a first non-gradient layer having a first constant energy band gap, and the single barrier is composed of a second non-gradient layer having a second constant energy band gap adjacent to the first conductivity type semiconductor layer or the second conductivity type semiconductor layer,
   wherein the first non-gradient layer directly contacts with the well.

* * * * *